(12) United States Patent
Knoedgen (10) Patent No.: US 6,750,705 B2
(45) Date of Patent: Jun. 15, 2004

(54) CLASS D AMPLIFIER ENERGY CONTROL

(75) Inventor: Horst Knoedgen, Munich (DE)

(73) Assignee: Dialog Semiconductor GmbH, Kirchheim (DE)

( * ) Notice: Subject to any disclaimer, the term of this patent is extended or adjusted under 35 U.S.C. 154(b) by 18 days.

(21) Appl. No.: 10/120,833

(22) Filed: Apr. 11, 2002

(65) Prior Publication Data

US 2003/0184376 A1 Oct. 2, 2003

(30) Foreign Application Priority Data

Apr. 2, 2002 (EP) .............................................. 02392005

(51) Int. Cl.$^7$ .............................. H03F 3/38; H03F 3/217
(52) U.S. Cl. ..................................... 330/10; 330/207 A
(58) Field of Search .............................. 330/10, 207 A, 330/251

(56) References Cited

U.S. PATENT DOCUMENTS

| | | | |
|---|---|---|---|
| 5,672,998 A | 9/1997 | Wittlinger | 330/10 |
| 5,815,581 A | 9/1998 | Andersson | 381/68.4 |
| 6,107,875 A | 8/2000 | Pullen et al. | 330/10 |
| 6,262,632 B1 | 7/2001 | Corsi et al. | 330/251 |
| 6,362,683 B1 * | 3/2002 | Miao et al. | 330/10 |

OTHER PUBLICATIONS

Smedley et al., "One Cycle Control of Switching Converters", Proc. of the Annual Power Elec. Spec. Conf., Mass., Jun. 25–27, 1991, NY, IEEE, U.S., vol. 22, Jun. 24, 1991, pp. 888–896, XP010048415.

Zheren Lai et al., "A Low Distortion Switching Audio Power Amplifier", IEEE No. 0–7803–2730–6/95, 1995, pp. 174–180, XP002198564.

* cited by examiner

*Primary Examiner*—Steven J. Mottola
(74) *Attorney, Agent, or Firm*—George O. Saile; Stephen B. Ackerman; Douglas R. Schnabel

(57) ABSTRACT

An energy control circuit for a class D amplifier is achieved. The energy control circuit comprises, first, a means of generating an energy accumulation signal proportional to an output drive signal of the class D amplifier. Last, a means of receiving the energy accumulation signal and of interrupting the output drive signal when the energy accumulation signal exceeds a reference level. Single-ended and H-bridge amplifiers are achieved.

19 Claims, 6 Drawing Sheets

CLASS D AMPLIFIER ENERGY CONTROL

BACKGROUND OF THE INVENTION

1. Field of the Invention

The invention relates to class D amplifier circuits, and more particularly, to a method and a circuit to improve the power supply rejection ratio of a class D amplifier circuit.

2. Description of the Prior Art

Figure 1:
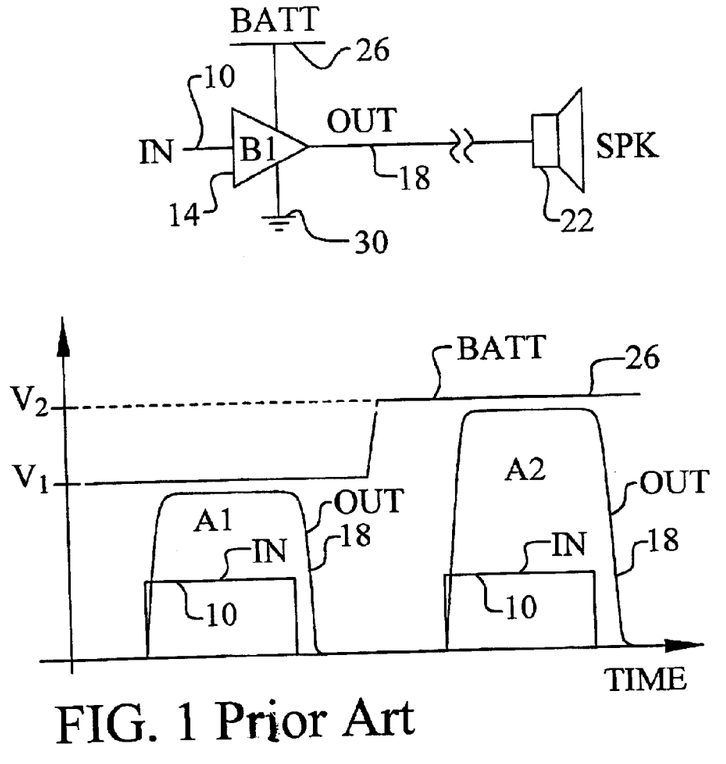
FIG. 1 illustrates a prior art class D amplifier circuit.

Class D amplifiers are used in a variety of applications. Increasingly, MOSFET-based, class D amplifiers are used in audio applications. Referring now to FIG. 1, a simplified schematic for a class D audio amplifier is shown. A CMOS buffer B1 14 is used as the audio amplifier. The buffer B1 14 receives the input signal IN 10 and generates the output signal OUT 18. The output signal OUT 18 drives an audio speaker SPK 22, though the coupling may be indirect, such as through a capacitor.

As shown in the diagram, the CMOS buffer 14 converts the input signal IN 10 into the output OUT 18. Note that the output voltage 18 varies directly with the battery voltage BATT 26 powering the buffer 14. During the first signal pulse, the battery BATT 26 level is $V_1$. However, during the second pulse, the battery level becomes $V_2$. The output level OUT 18 increases due to the increase in the BATT 26 level. The energy transferred to the speaker SPK 22 by the class D amplifier is proportional to the output OUT 18 voltage multiplied by the ON time. Therefore, the energy transfer for the first pulse is proportional to the area under the signal curve (A1) while the energy transfer of the second pulse is proportional to the area A2. It can be clearly seen that the variation in battery voltage BATT 22 causes a large difference in energy transfer which translates into a large difference in speaker SPK 22 loudness. The variation in BATT 22 may be due to a large signal DC shift, as shown, or due to a large signal AC component that has been coupled onto the battery supply. Either way, the prior art circuit displays poor power supply rejection ratio (PSRR). The analysis of the simplified, prior art class D amplifier shows that either scenario may result in significant speaker SPK 22 loudness variation.

Several prior art inventions describe class D amplifiers. U.S. Pat. No. 6,107,875 to Pullen discloses a class D amplifier. A frequency compensation and gain control circuit is used to improve frequency performance. An integrator is used in the circuit. U.S. Pat. No. 6,262,632 to Corsi et al describes a class D amplifier using a ramp generator to create a delay to eliminate cross-talk. U.S. Pat. No. 5,815,581 to Andersson teaches a class D amplifier having a feedback loop. U.S. Pat. No. 5,672,998 to Wittlinger discloses a class D amplifier having a feedback loop using a pulse width modulated signal to reduce distortion.

SUMMARY OF THE INVENTION

A principal object of the present invention is to provide an effective and very manufacturable class D amplifier circuit.

A further object of the present invention is to provide a class D amplifier circuit with energy control to improve the power supply rejection ratio (PSSR).

A still further object of the present invention is to provide an energy control circuit for a class D amplifier using an analog feedback loop.

Another still further object of the present invention is to provide an improved H-bridge driver based on a class D amplifier having energy control.

Another further object of the present invention is to provide a method to improve a class D amplifier through energy control.

In accordance with the objects of this invention, an energy control circuit for a class D amplifier is achieved. The energy control circuit comprises, first, a means of generating an energy accumulation signal proportional to an output drive signal of the class D amplifier. Last, a means of receiving the energy accumulation signal and of interrupting the output drive signal when the energy accumulation signal exceeds a reference level is used.

Also in accordance with the objects of this invention, an H-bridge amplifier circuit is achieved. The circuit comprises, first, a first class D amplifier. The first class D amplifier comprises, first, a first output driver for receiving a first input signal and for generating a first output drive signal corresponding to the first input signal. Second, a first integrator generates a first energy accumulation signal proportional to the first output drive signal of the first class D amplifier. Finally, a first comparator receives the first energy accumulation signal and generates a first reset signal to interrupt the first output drive signal when the first energy accumulation signal exceeds a reference level. Second, a second class D amplifier comprises, first, a second output driver that receives a second input signal and that generates a second output drive signal corresponding to the second input signal. Second, a second integrator generates a second energy accumulation signal proportional to a second output drive signal of the second class D amplifier. Finally, a second comparator receives the second energy accumulation signal and generates a second reset signal to interrupt the second output drive signal when the second energy accumulation signal exceeds a reference level. The first output drive signal and the second output drive signal are coupled with a load therebetween.

Also in accordance with the objects of the present invention, a method to perform energy control for a class D amplifier is achieved. The method comprises, first, generating an energy accumulation signal proportional to an output drive signal of the class D amplifier. Second, the output drive signal is interrupted when the energy accumulation signal exceeds a reference level.

BRIEF DESCRIPTION OF THE DRAWINGS

In the accompanying drawings forming a material part of this description, there is shown.

DESCRIPTION OF THE PREFERRED EMBODIMENTS

The preferred embodiments disclose a novel class D amplifier circuit and a method of controlling the output energy of a class D amplifier. The novel circuit and method generate an energy accumulation signal that is proportional to the output drive voltage. The output drive signal is interrupted when the energy accumulation signal exceeds a reference value to thereby improve the PSRR of the amplifier. The method and circuit are disclosed in single-ended and in H-bridge driver embodiments. It should be clear to those experienced in the art that the present invention can be applied and extended without deviating from the scope of the present invention.

Figure 2:
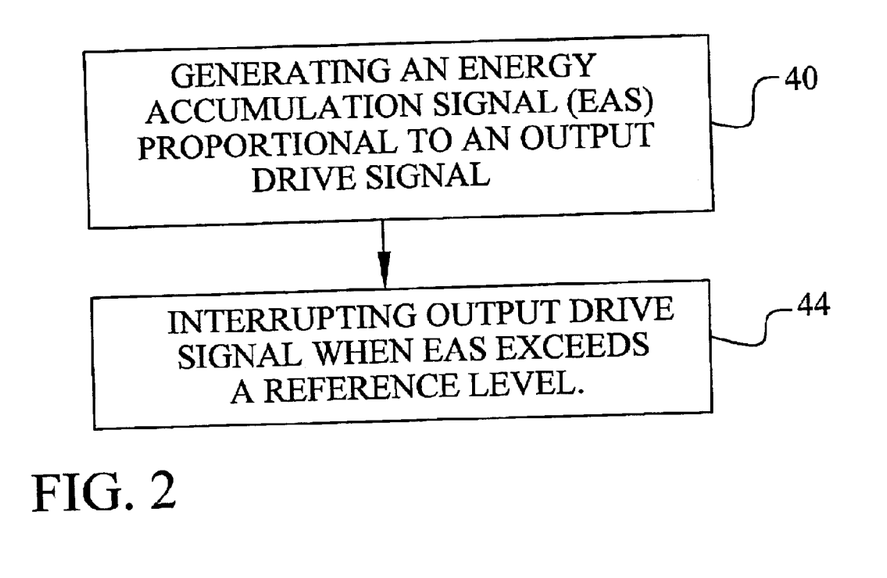
FIG. 2 illustrates a preferred embodiment of the class D amplifier energy control method of the present invention.

Referring now to FIG. 2, a preferred embodiment of the method of the present invention is illustrated. Several important features of the present invention are shown. In the method, an energy accumulation signal (EAS) is generated in step 40. The EAS is proportional to the output drive signal of the class D amplifier. In step 44, the output drive signal is interrupted when the EAS exceeds a reference level. By controlling the output energy level of the class D amplifier in this ways the novel method of the present invention limits the effect of power supply variation and enhances the PSRR of the amplifier.

Figure 3:
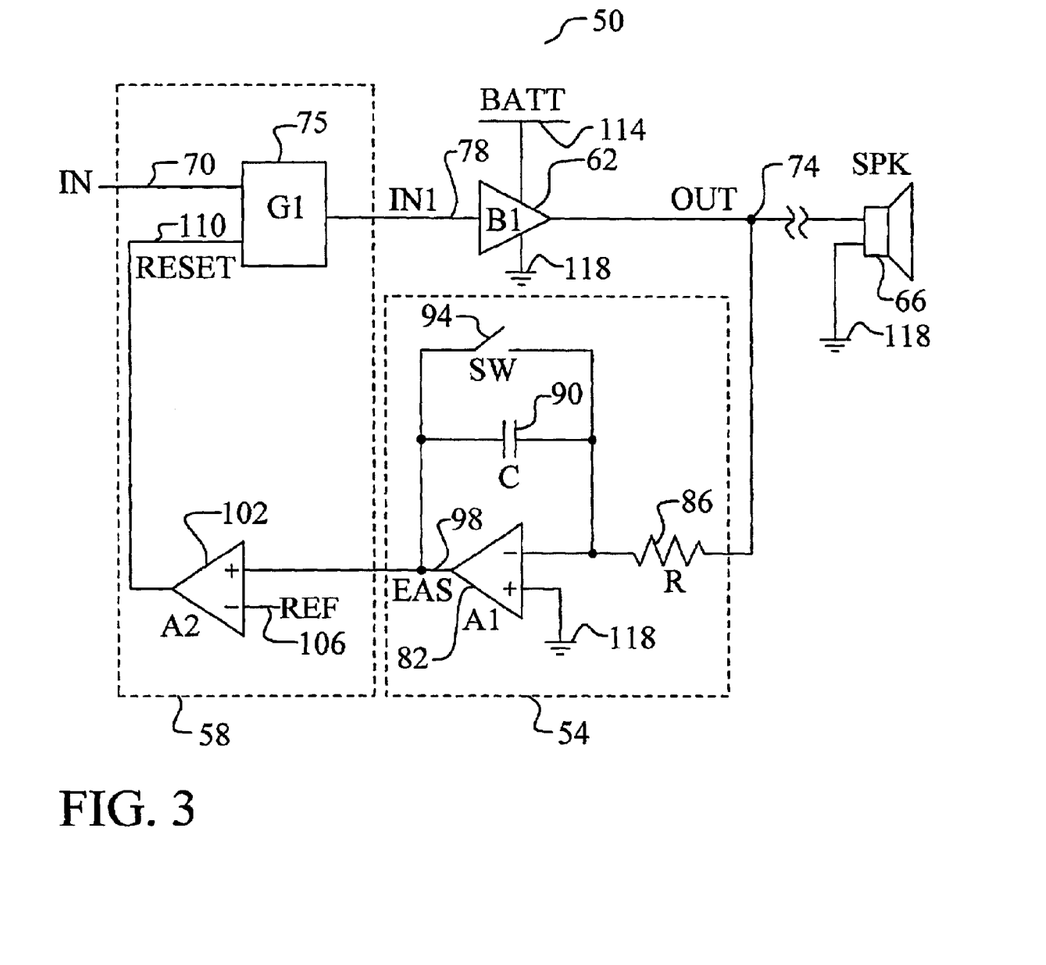
FIG. 3 illustrates a first preferred embodiment of the class D amplifier circuit of the present invention.

Referring now to FIG. 3, a first preferred embodiment of the class D amplifier circuit 50 of the present invention is illustrated. Several important features of the present invention are shown. An output buffer B1 62 is coupled to an input signal IN 70 and generates an output drive signal OUT 74. In this embodiment, the input signal IN 70 generates the intermediate signal IN1 78 through the combinational logic circuit G1 75. The output buffer B1 62 preferably comprises a CMOS transistor pair such as an inverter or a series of inverters as is well known in the art. The output buffer B1 62 is powered by the supply BATT 114. The class D amplifier 50 drives a load, and, more preferably, drives an audio speaker SPK 66. The output drive signal OUT 74 preferably comprises a digital output that swings between the battery supply BATT 114 and ground 118. This first embodiment class D amplifier provides a single-ended output to the load SPK 66.

As a first important feature, a means of generating 54 an energy accumulation signal (EAS) 98 is added to the class D amplifier circuit 50. An energy accumulation signal (EAS) 98 is herein defined as a signal having a value proportional to the energy transferred to the load 66. The EAS 98 is preferably generated using an integrator 54 circuit. In this first embodiment of the present invention, the integrator circuit 54 is implemented as an amplifier A1 82 and a capacitor C 90.

Assuming an ideal operational amplifier, A1 82 forces the inverting and non-inverting inputs to the same voltage. Therefore, the current through resistor R 86 is proportional to the output voltage OUT 74. If the switch SW 94 is open and if the input impedance of A1 82 is very large, then all of the amplifier current flows through the capacitor C 90. This current charges the capacitor C 90 over time. A resulting integral value EAS 98, with respect to time, is proportional to the output energy of the class D amplifier 50.

The switch SW 94 is in the ON-state when the input signal IN 70 is low. The capacitor C 90 is thereby shorted out, and EAS 98 is grounded. EAS 98 is thereby held in the standby state. When IN 70 goes to the high state, the switch SW 94 transitions to the OFF-state. The integrator 54 is then active for charging the capacitor C 90.

Another important feature of the present invention is a means of interrupting 58 the output drive signal OUT 74. The EAS signal 98 is compared to a reference value REF 106, preferably using a comparator A2 102. When the EAS output 98 of the integrator circuit 54 exceeds the reference REF 106, then the input reset RESET 110 is asserted. The RESET 110 is combined with the input signal IN 70 in the combinational logic block G1 75. If RESET ±0 is asserted, then IN1 78 is forced low. If RESET 110 is not asserted, then IN1 equals IN 70.

Figure 4:
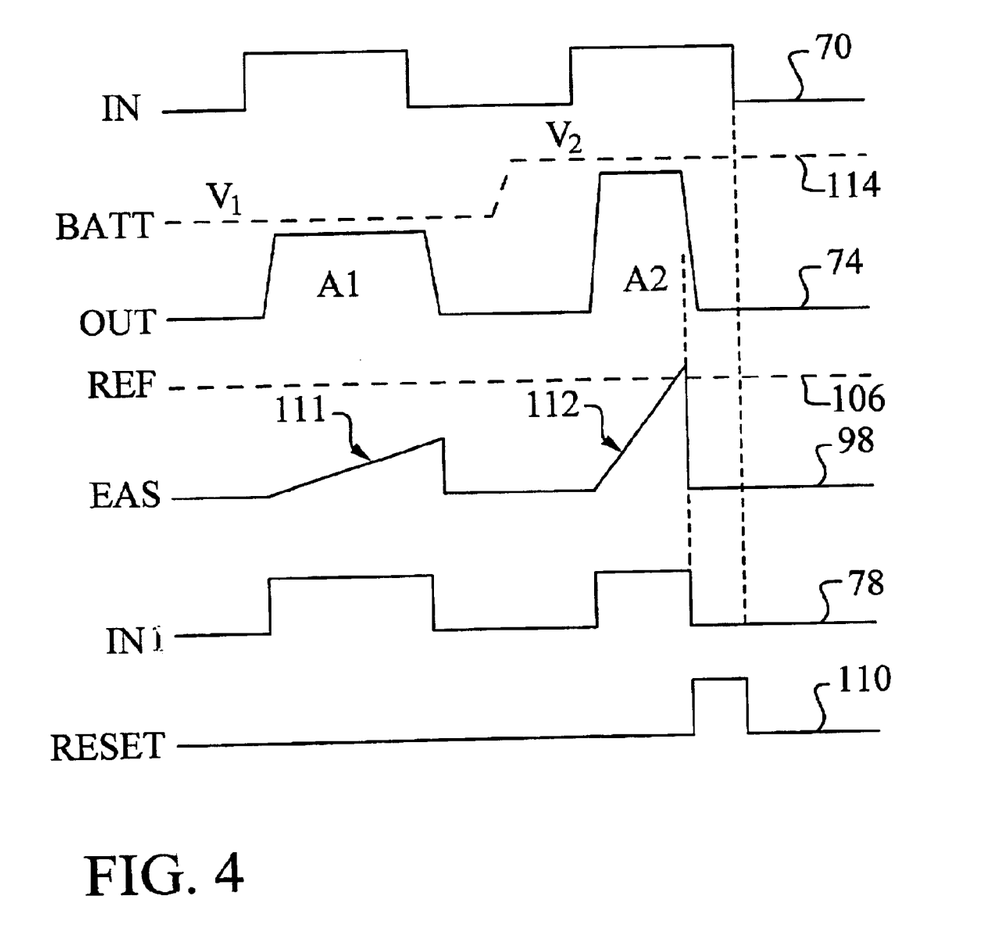
FIG. 4 illustrates the performance of the first preferred embodiment of the present invention and demonstrates the energy control capability.

Referring now to FIG. 4, the operation of the first preferred embodiment circuit is illustrated. Two transistions of the input signal IN 70 are shown. During the first IN 70 pulse, the battery voltage BATT 114 is at a first level $V_1$. During the second IN 70 pulse, BATT 114 is at a second level $V_2$. As in the prior art case, the output drive signal OUT 74 reflects the change in battery voltage.

During each IN 70 pulse, the integrator circuit 54 generates the EAS signal 98. The difference in BATT voltage 74, V1 and V21 is reflected in the different slopes 111 and 112 of the EAS signal 98. During the first pulse, the EAS signal 98 does not reach the REF 106 level of the comparator 102. However, during the second pulse, the EAS signal 98 reaches the REF voltage 106. Therefore, a RESET pulse 110 is generated and results in an interrupt in the output drive signal OUT 74.

Due to the interrupt in the output drive, the integral areas, A1 and A2, of the output voltage OUT 74 are approximately equal. Therefore, the output power of the class D amplifier 50 of the present invention remains nearly the same for each of the pulses though the supply voltage has changed. In this way, the PSRR of the class D amplifier 50 is greatly improved.

Figure 5:
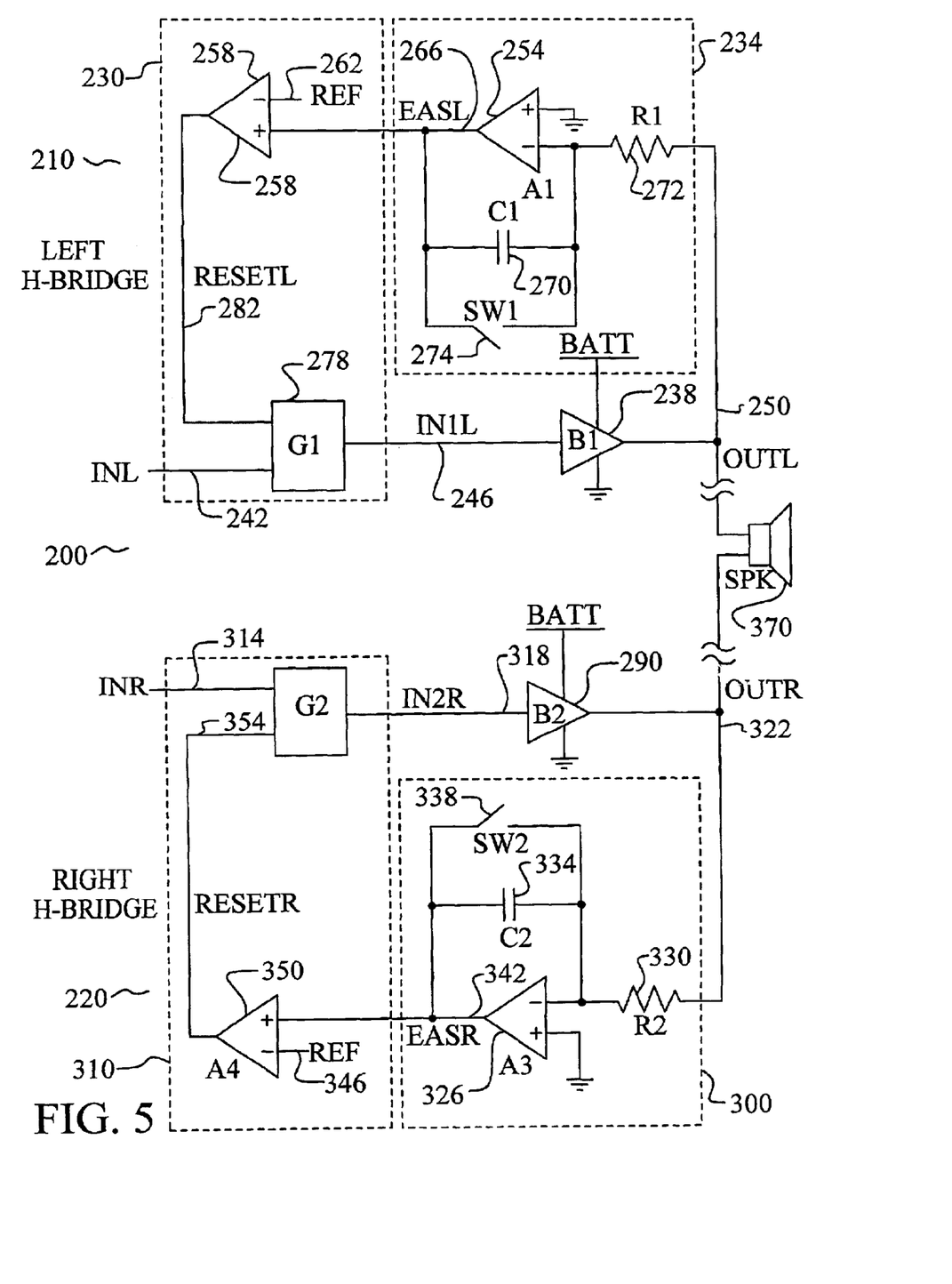
FIG. 5 illustrates a second preferred embodiment of the present invention where the class D amplifier is used in an H-bridge circuit.

Referring now to FIG. 5, a second preferred embodiment of the present invention is shown. In this embodiment, the novel class D amplifier of the present invention is applied to an H-switch circuit. In this case, two signals, INL 242 and INR 314, are used to generate the double-ended outputs OUTL 250 and OUTR 322 to drive the output speaker SPK 370.

The circuit comprises, first, a first class D amplifier 210. The first class D amplifier 210 comprises, first, a first output driver B1 238 for receiving a first input signal INL 242 and for generating a first output drive signal OUTL 250 corresponding to the first input signal. Second, a first integrator 234 generates a first energy accumulation signal 266 (EASL) proportional to the first output drive signal OUTL 250 of the first class D amplifier 210. Finally, a first comparator 258 receives the first energy accumulation signal EASL 266 and generates a first reset signal RESETL 282 to interrupt the first output drive signal OUTL 250 when the first energy accumulation signal EASL 266 exceeds a reference level REF 262.

Second, a second class D amplifier 220 comprises, first, a second output driver B2 290 for receiving a second input signal INR 314 and for generating a second output drive signal OUTR 322 corresponding to the second input signal INR 314. Second, a second integrator 300 generates a second energy accumulation signal EASR 342 proportional to second output drive signal OUTR 322 of the second class D amplifier 220. Finally, a second comparator 350 receives the second energy accumulation signal EASR 342 and generates a second reset signal RESETR 354 to interrupt the second output drive signal OUTR 322 when the second energy accumulation signal EASR 342 exceeds a reference level REF 346. The first output drive signal OUTL 250 and the second output drive signal OUTR 322 are coupled with a load SPK 370 therebetween.

The operation of the first and second class D amplifiers 210 and 220 is the same as that described above for the class D amplifier of the first embodiment. The energy control mechanisms of each of the class D amplifiers 210 and 220 are independent.

Figure 6:
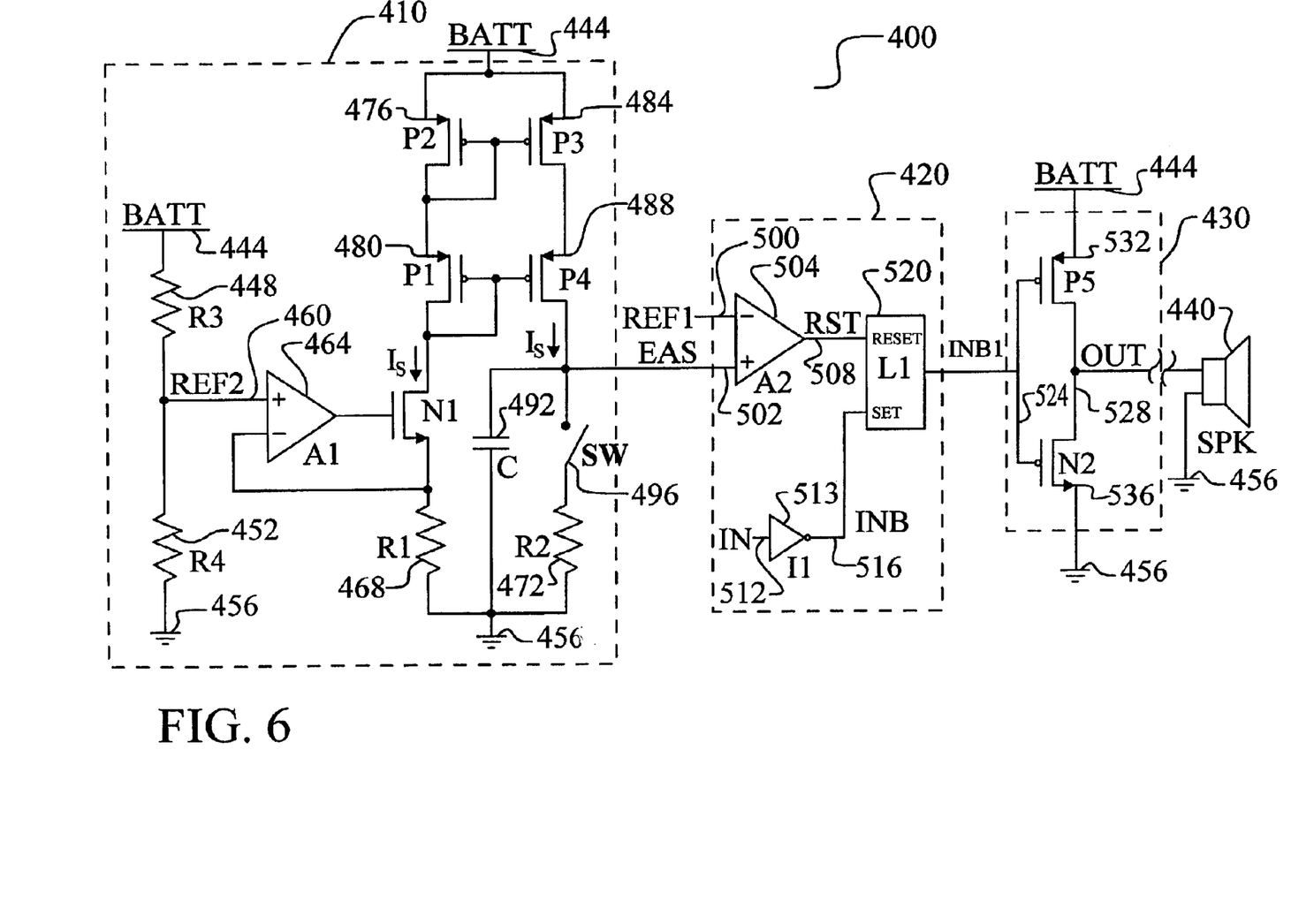
FIG. 6 illustrates a third preferred embodiment of the present invention where the integrator is implemented as a current source and capacitor.

Referring now to FIG. 6, a third preferred embodiment of the present invention is illustrated. In this embodiment, the output buffer 430 preferably comprises a CMOS inverter P5 532 and N5 536. An integrator stage 410 and a comparator stage 420 are again used in analog feedback to provide energy control. However, in this embodiment, the integrator 410 comprises a current source $I_s$ and a capacitor C 492. The current source $I_s$ is formed by a voltage follower 464 coupled to a voltage reference REF2 460. In this embodiment, the voltage reference REF2 460 is derived from the battery source BATT 444. The voltage follower 464 forces the REF2 460 voltage across the resistor R1 468. This establishes the constant current source $I_s$. A current mirror formed by P1 480, P2 476, P3 484, and P4 488 mirrors the constant current source $I_s$ to the RC network formed by C 492, R2 472, and the SW 496.

When the input signal IN 512 is low, the switch SW 496 is turned ON so that the EAS voltage is set by the constant current source $I_s$ multiplied by R2 472. When IN goes high, SW is turned OFF so that the constant current source $I_s$ charges the capacitor C 492 and creating the integrator function 410. Further, note that the constant current source $I_s$ is proportional to BATT 444. Therefore, the slope of the EAS signal 502 will correspond to the battery BATT 444 voltage and, therefore, to the power output of the amplifier 400.

The comparator stage 420 preferably uses the comparator circuit, 504 to compare the EAS signal 502 to the reference REF1 500. A reset signal RST 508 is generated when EAS 502 exceeds the reference REF1 500. The gate I1 513 and the flip-flop, or latch, L1 520 allow RST 508 to interrupt the output drive signal OUT 528. The output begins with a pulse at IN 512 to set L1 520. The output ends when RST 508 resets L1 520. The embodiment shows a single-ended class D output. Further, this embodiment may be extended to form an H-bridge output wherein two class D amplifiers of the form of this embodiment are used.

Figure 7:
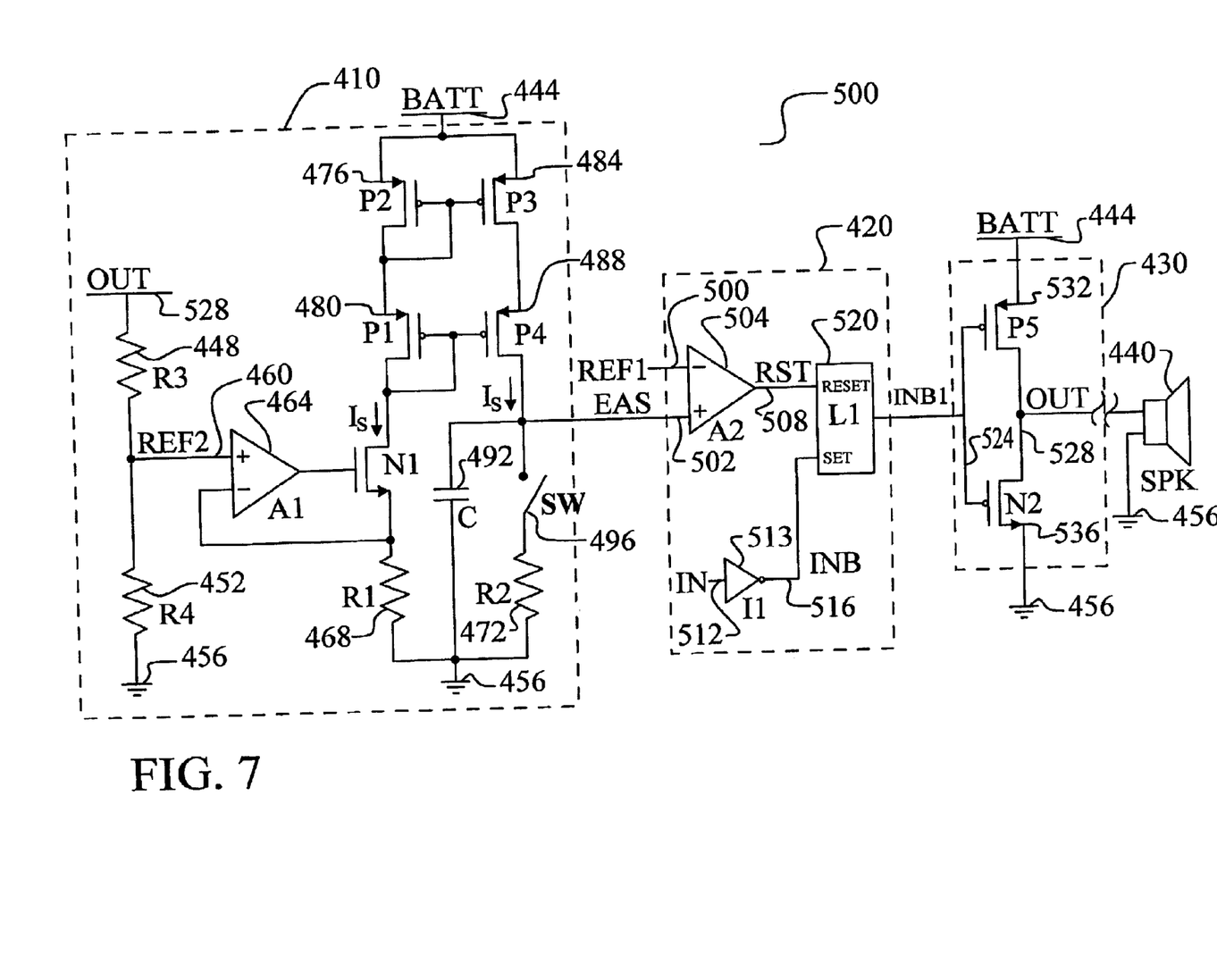
FIG. 7 illustrates a fourth preferred embodiment of the present invention where the integrator is implemented as a current source and capacitor and where the integrator current is derived from the output voltage.

Referring now to FIG. 7, a fourth preferred embodiment of the present invention is shown. In this embodiment of the power amplifier 500, the voltage reference REF2 460 is derived from the output voltage OUT 528. OUT 528 sources the voltage divider R3 448 and R4 452 such that the integrator current $I_s$ is directly proportional to the output voltage OUT 528. In all other respects, the fourth embodiment is the same as the third embodiment described above.

The advantages of the present invention may now be summarized. An effective and very manufacturable class D amplifier circuit is achieved. The class D amplifier circuit uses energy control to improve the power supply rejection ratio (PSSR). The energy control circuit for the class D amplifier uses an analog feedback to improve PSRR. Further, an improved H-bridge driver is provided based on a class D amplifier having energy control. Finally, a method to improve the class D amplifier through energy control is disclosed.

As shown in the preferred embodiments, the novel circuit and method provide an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. An energy control circuit for a class D amplifier, said energy control circuit comprising:
    a means of generating an energy accumulation signal proportional to an output drive signal of said class D amplifier wherein said means of generating comprises a constant current source and a capacitor and wherein said constant current source is proportional to said output drive signal; and
    a means of interrupting said output drive signal when said energy accumulation signal exceeds a reference level.

2. The circuit according to claim 1 wherein said output drive signal is coupled to a load comprising an audio speaker.

3. The circuit according to claim 1 wherein said output drive signal comprises a digital signal.

4. The circuit according to claim 1 wherein said means of interrupting said output drive signal comprises a comparator.

5. The circuit according to claim 1 wherein said class D amplifier comprise one half of an H-bridge circuit.

6. A class D amplifier comprising:
    an output driver for generating an output drive signal corresponding to an input signal;
    an integrator for generating an energy accumulation signal proportional to said output drive signal of said class D amplifier wherein said integrator comprises a constant current source and a capacitor and wherein said constant current source is proportional to said output drive signal; and
    a comparator for generating a reset signal to interrupt said output drive signal when said energy accumulation signal exceeds a reference level.

7. The circuit according to claim 6 wherein said output drive signal is coupled to a load comprising an audio speaker.

8. The circuit according to claim 6 wherein said output drive signal comprises a digital signal.

9. The circuit according to claim 6 wherein said class D amplifier comprise one half of an H-bridge circuit.

10. An H-bridge amplifier circuit comprising:
    a first class D amplifier comprising:
        a first output driver for generating a first output drive signal corresponding to a first input signal;
        a first integrator for generating a first energy accumulation signal proportional to said first output drive signal of said first class D amplifier; and
        a first comparator for generating a first reset signal to interrupt said first output drive signal when said first energy accumulation signal exceeds a reference level; and
    a second class D amplifier comprising:
        a second output driver for generating a second output drive signal corresponding to a second input signal;
        a second integrator for generating a second energy accumulation signal proportional to second output drive signal of said second class D amplifier; and
        a second comparator for generating a second reset signal to interrupt said second output drive signal when said second energy accumulation signal exceeds a reference level wherein said first output drive signal and said second output drive signal are coupled with a load therebetween.

11. The circuit according to claim 10 wherein said load comprises an audio speaker.

12. The circuit according to claim 10 wherein each of said first and second output drive signals comprises a digital signal.

13. The circuit according to claim 10 wherein each of said first and second integrators comprises:
   an operational amplifier; and
   a capacitor wherein corresponding said output drive signal is coupled to said integrator.

14. The circuit according to claim 10 wherein each of said first and second integrators comprises:
   a constant current source; and
   a capacitor wherein said constant current source is proportional to corresponding said output drive signal.

15. A method to perform energy control for a class D amplifier, said method comprising:
   generating an energy accumulation signal proportional to an output drive signal of said class D amplifier wherein said generating is by an integrator comprising:
   a constant current source; and
   a capacitor wherein said constant current source is proportional to said output drive signal; and
   interrupting said output drive signal when said energy accumulation signal exceeds a reference level.

16. The method according to claim 15 wherein said output drive signal is coupled to a load comprising an audio speaker.

17. The method according to claim 15 wherein said output drive signal comprises a digital signal.

18. The method according to claim 15 wherein said step of interrupting said output drive signal is performed by a comparator.

19. The method according to claim 15 wherein said class D amplifier comprise one half of an H-bridge circuit.

* * * * *